United States Patent [19]
Michon

[11] 3,935,446
[45] Jan. 27, 1976

[54] APPARATUS FOR SENSING RADIATION AND PROVIDING ELECTRICAL READOUT

[75] Inventor: Gerald J. Michon, Waterford, N.Y.

[73] Assignee: General Electric Company, Schenectady, N.Y.

[22] Filed: Feb. 28, 1975

[21] Appl. No.: 554,155

[52] U.S. Cl. .............................. 250/211 J; 357/32
[51] Int. Cl.$^2$ .......................................... H01J 39/12
[58] Field of Search ............. 250/211 R, 211 J, 578, 250/209; 340/173 R, 173 LS, 173 CR; 357/30, 32

[56] References Cited
UNITED STATES PATENTS

| | | | |
|---|---|---|---|
| 3,488,508 | 1/1970 | Weimer | 250/211 J |
| 3,601,668 | 8/1971 | Slaten | 357/30 |
| 3,660,667 | 5/1972 | Weimer | 250/209 |
| 3,717,770 | 2/1973 | Dyck | 357/32 |

*Primary Examiner*—Archie R. Borchelt
*Assistant Examiner*—D. C. Nelms
*Attorney, Agent, or Firm*—Julius J. Zaskalicky; Joseph T. Cohen; Jerome C. Squillaro

[57] ABSTRACT

An array of radiation sensing devices each including a pair of closely coupled conductor-insulator-semiconductor cells, one a row line connected cell and the other a column line connected cell, is provided on a common semiconductor substrate. The potential well associated with the row connected cell is deeper than the potential well associated with the column connected cell. Read out of a row of devices is accomplished by lowering the absolute potential of the row line to cause charge stored in the row connected cells to transfer to column connected cells of the row. The voltage on each of the column lines is sensed in sequence to provide a video signal. Subsequent to sensing the column line potentials can be lowered to inject the stored carriers into the substrate or the row line potential may be reestablished to return the stored charge to the potential wells associated with the cells connected to the row lines and thus permit repeated read out.

9 Claims, 27 Drawing Figures

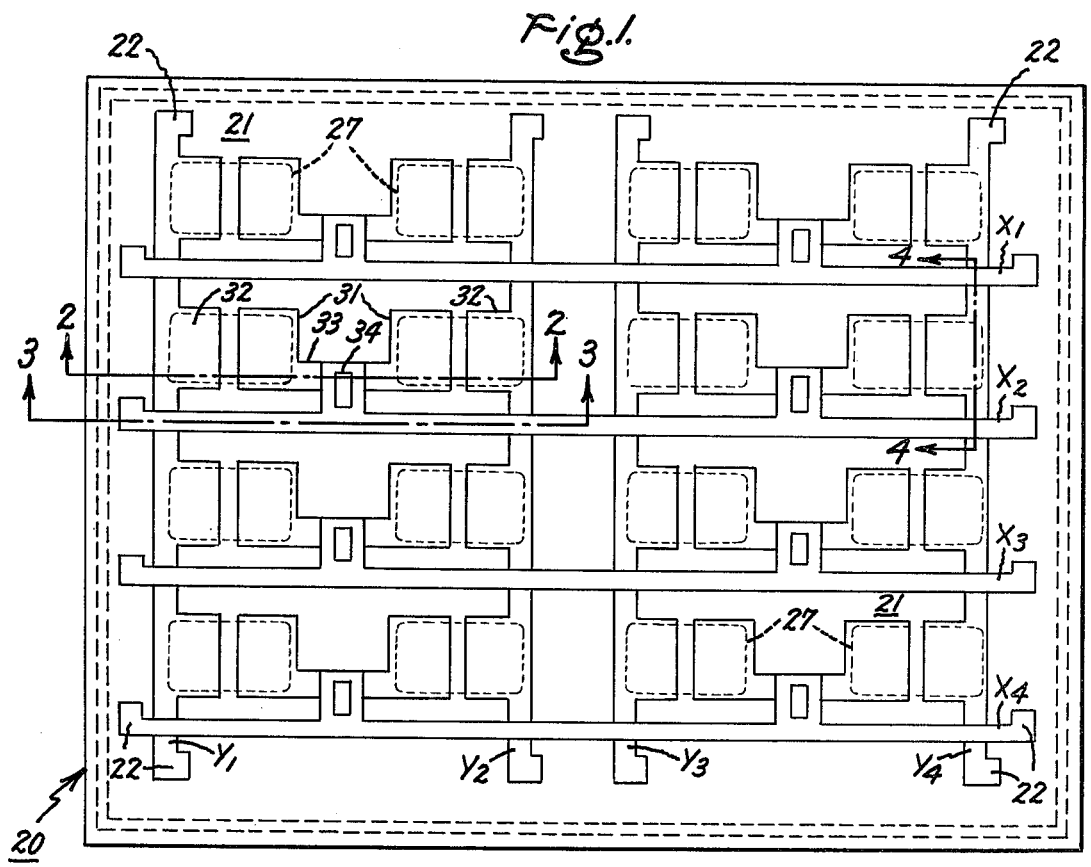
Fig. 1.
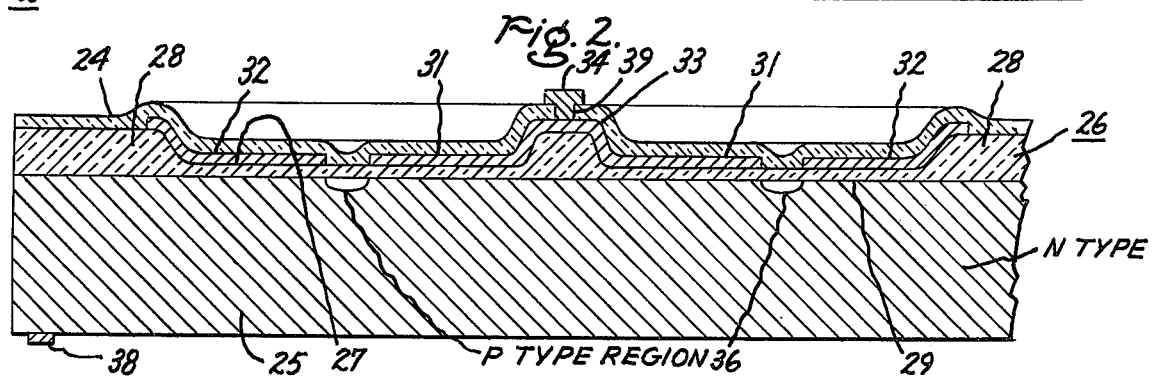
Fig. 2.
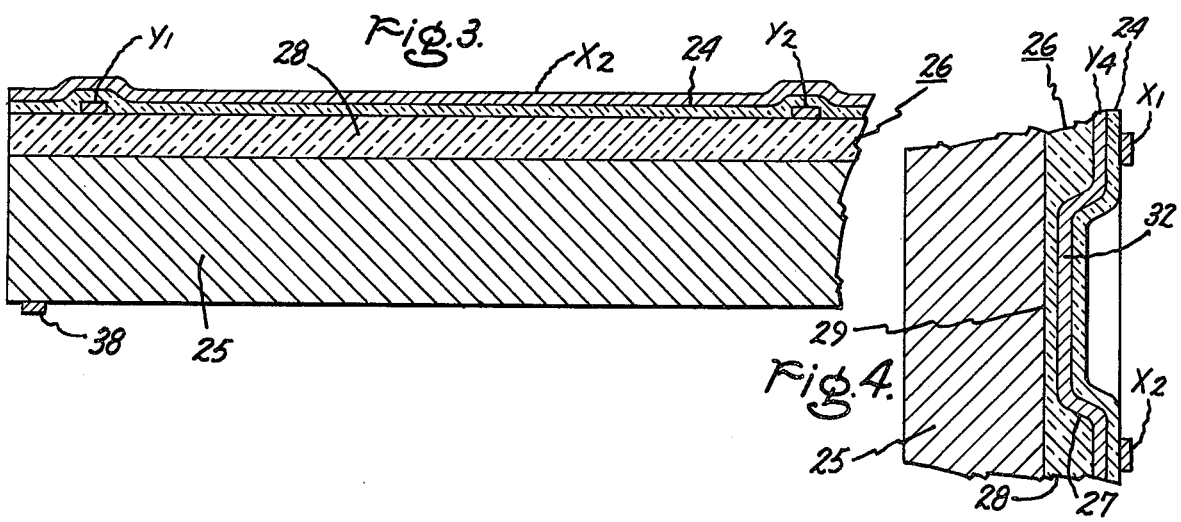
Fig. 3.
Fig. 4.

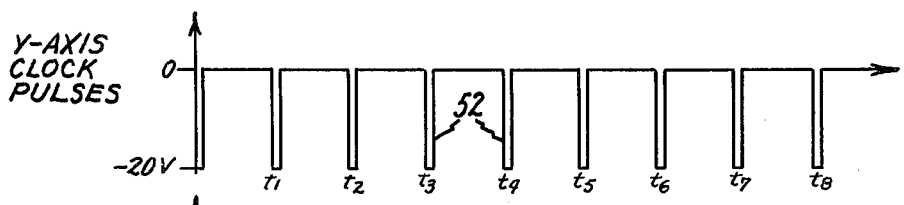
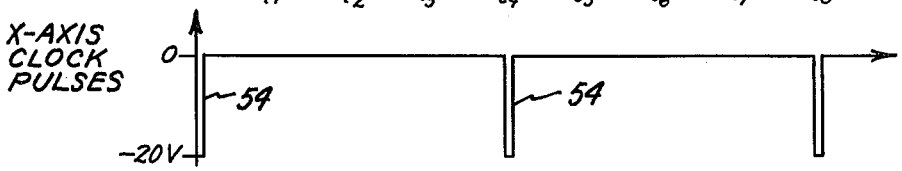
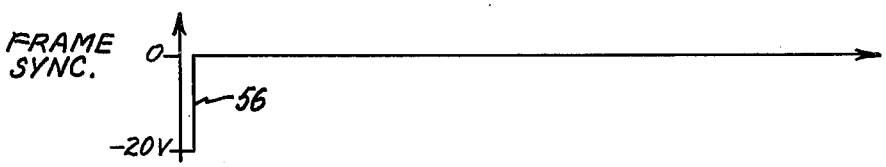
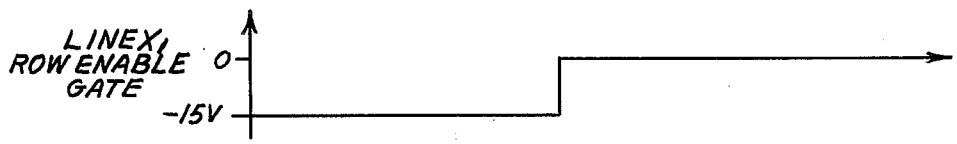
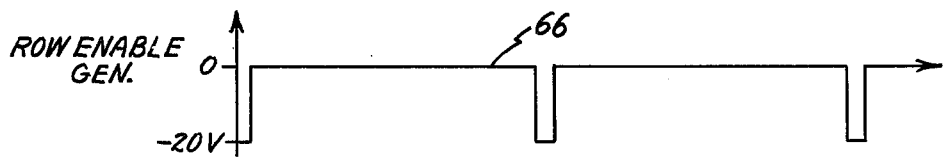
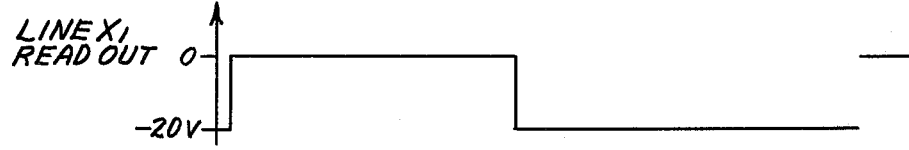
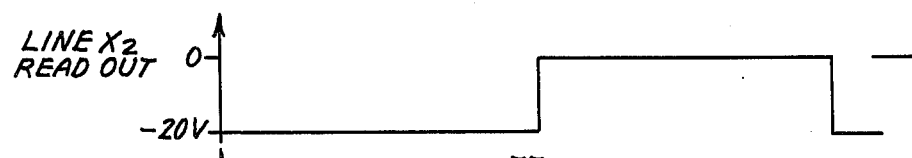
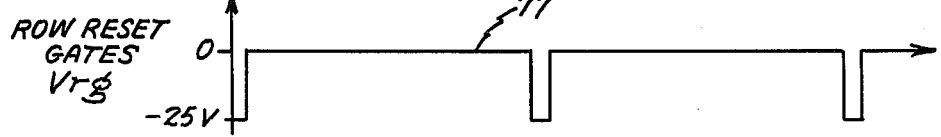
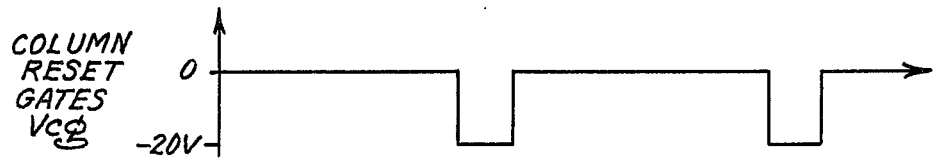
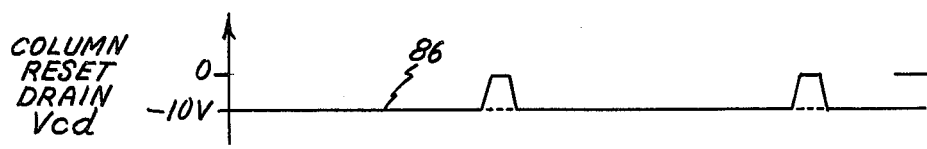

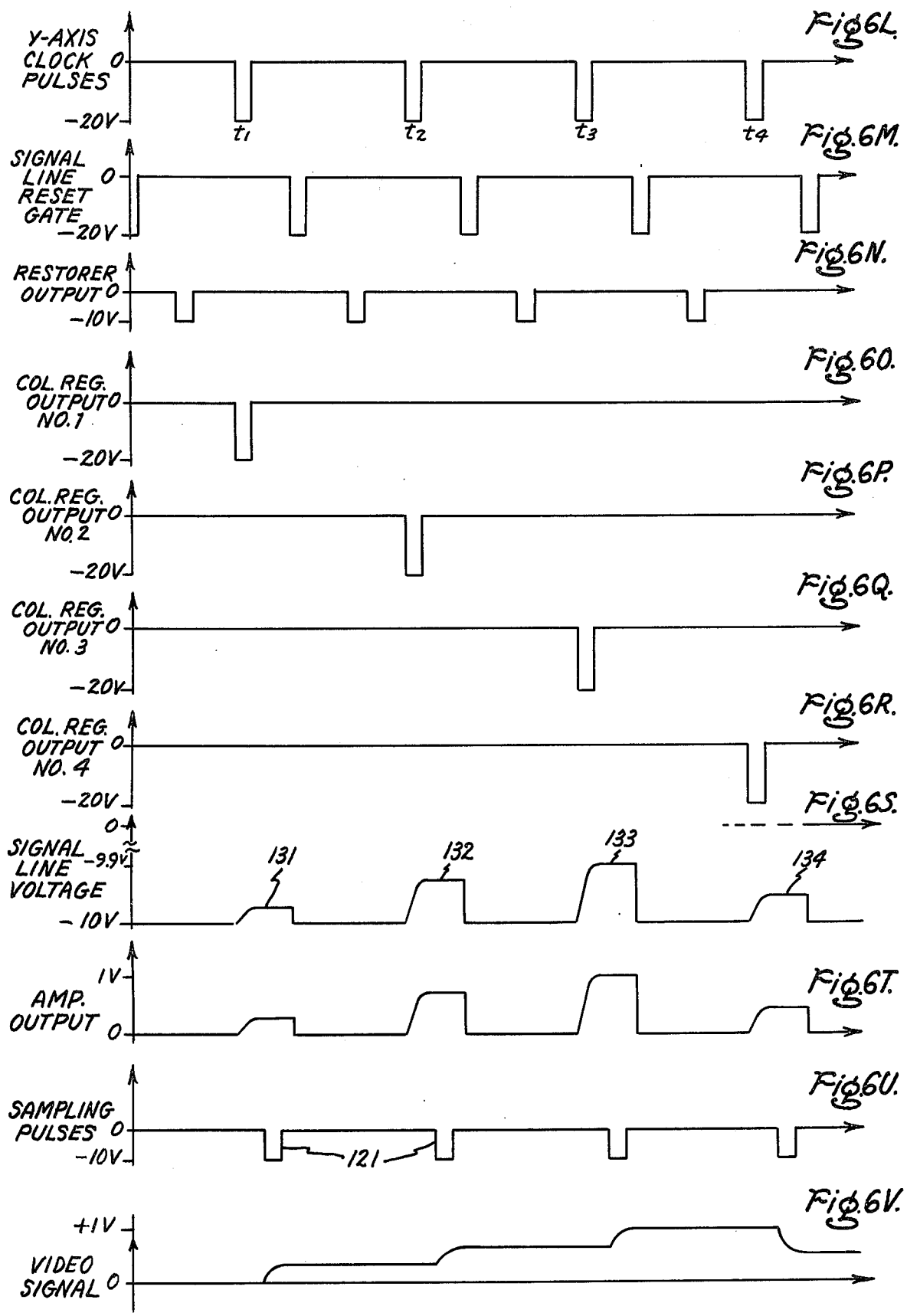

APPARATUS FOR SENSING RADIATION AND PROVIDING ELECTRICAL READOUT

The present invention relates in general to apparatus including devices and circuits therefor for sensing radiation and developing electrical signals in accordance therewith. The present invention relates in particular to such apparatus which senses and stores charge produced by electromagnetic radiation flux and which provides an electrical readout of the stored charge.

This application relates to improvements in the apparatus of U.S. Pat. No. 3,805,062 assigned to the assignee of the present application, which patent is incorporated herein by reference thereto.

The radiation sensing apparatus specifically disclosed in the aforementioned patent comprises a substrate of semiconductor material of one conductivity type having a plurality of storage sites arranged in a plurality of rows and columns for storage of radiation generated minority carriers therein. Each of the storage sites includes a row oriented conductor-insulator-semiconductor capacitive cell and a closely coupled column oriented conductor-insulator-semiconductor capacitive cell. Each of the row-oriented conducting members or plates of a row of sites are connected to a respective row conductor line. Each of the column-oriented conducting members or plates of a column of sites are connected to a respective column conductor line. Switching means are provided for periodically connecting and disconnecting the substrate from ground or point of reference potential. Means are provided for charging the row and column conductor lines to predetermined potentials in relation to the potential of the point of reference potential to establish depletion regions in the substrate underlying each of the first and second conductive plates with the depletion regions underlying adjacent first and second conductive plates being coupled. Selective read out of charge stored in a row of sites is accomplished by changing the potential on the row line to cause flow of charge stored in the row-oriented storage cells thereof into the column-oriented storage cells thereof. The read out of charge stored in column-oriented cells is accomplished by changing the potential on each of the column lines in sequence to cause injection of carriers stored therein into the substrate in sequence and concurrently disconnecting the substrate from ground or reference potential during each such injection of carriers. Each such injection produces a respective current flow in circuit with the substrate which is sensed across an integrating capacitance which includes the inherent capacitance of the conductor lines and conducting members connected thereto in relation to the substrate. Means are provided for periodically sampling the variation in voltage developed on the integrating capacitance to provide an electrical output varying in time in accordance with the variation in amplitude of the samples.

As the number of storage sites in an array is increased the total inherent capacitance of the substrate in relation to ground or a point of reference potential increases and hence the signal voltage developed across the capacitance decreases. As a result, in arrays having a large number of pairs of storage cells the signal level can become quite small. In addition, injection of charge in each of the column oriented cells in a row in sequence is time consuming and limits the speed of scan of the row and hence the entire array. Furthermore, in such apparatus and mode of operation thereof only a single read out of the stored charges is possible.

The present invention is directed to overcoming limitations such as those outlined above in radiation responsive apparatus of the kind described above.

Accordingly an object of the present invention is to provide improved surface charge storage devices and method of operating such devices.

Another object of the present invention is to provide large arrays of radiation sensing elements of the kind described above which may be scanned at high speeds.

A further object of the present invention is to provide arrays of radiation sensing elements of the kind described above from which repeated read-out can be obtained.

In carrying out the invention in one illustrative embodiment thereof there is provided a substrate of semiconductor material of one conductivity type having a major surface. A plurality of first conductive plates are provided, each overlying and in insulated relationship to the major surface and forming a first conductor-insulator-semiconductor capacitor with the substrate. A plurality of second conductive plates are provided, each adjacent a respective first conductive plate to form a plurality of pairs of plates, the pairs of plates being arranged in a matrix of rows and columns, each of the second conductive plates overlying and in insulated relationship to the major surface and forming a second conductor-insulator-semiconductor capacitor with the substrate. Each second conductor-insulator-semiconductor capacitor is coupled to a respective first conductor-insulator-semiconductor capacitor so as to permit the transfer of stored charge between them. A plurality of row conductor lines are provided, the first conductive plates in each of the rows are connected to a respective row conductor line. A plurality of column conductor lines are provided, the second conductive plates in each of the columns are connected to a respective column conductor line. A first voltage means provides a first voltage between the row conductor lines and the substrate to deplete respective first portions of the substrate lying thereunder of majority charge carriers and provides a surface potential of a first value therein. A second voltage means provides a second voltage between the column conductor lines and the substrate to deplete respective second portions of the substrate lying thereunder of majority charge carriers and provides a surface potential of a second value therein. The second value of potential being substantially less than said first value of potential. Means are provided for exposing the substrate to radiation whereby charge is stored in the first portions of said substrate. A first means is provided for collapsing and reestablishing the first voltage on each of the row conductor lines in sequence during a respective first period of time. As a consequence charge stored in each of the first portions of the substrate moves to a respective second portion thereof. Means are provided for sensing in sequence the voltage on each of the column lines and deriving a video signal therefrom.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of a plurality of radiation responsive cells useful in the system of the present invention shown in FIG. 5.

FIG. 2 is a sectional view of the assembly of FIG. 1 taken along section lines 2—2 of FIG. 1.

FIG. 3 is a sectional view of the assembly of FIG. 1 taken along section lines 3—3 of FIG. 1.

FIG. 4 is a sectional view of the assembly of FIG. 1 taken along section lines 4—4 of FIG. 1.

Figure 5:
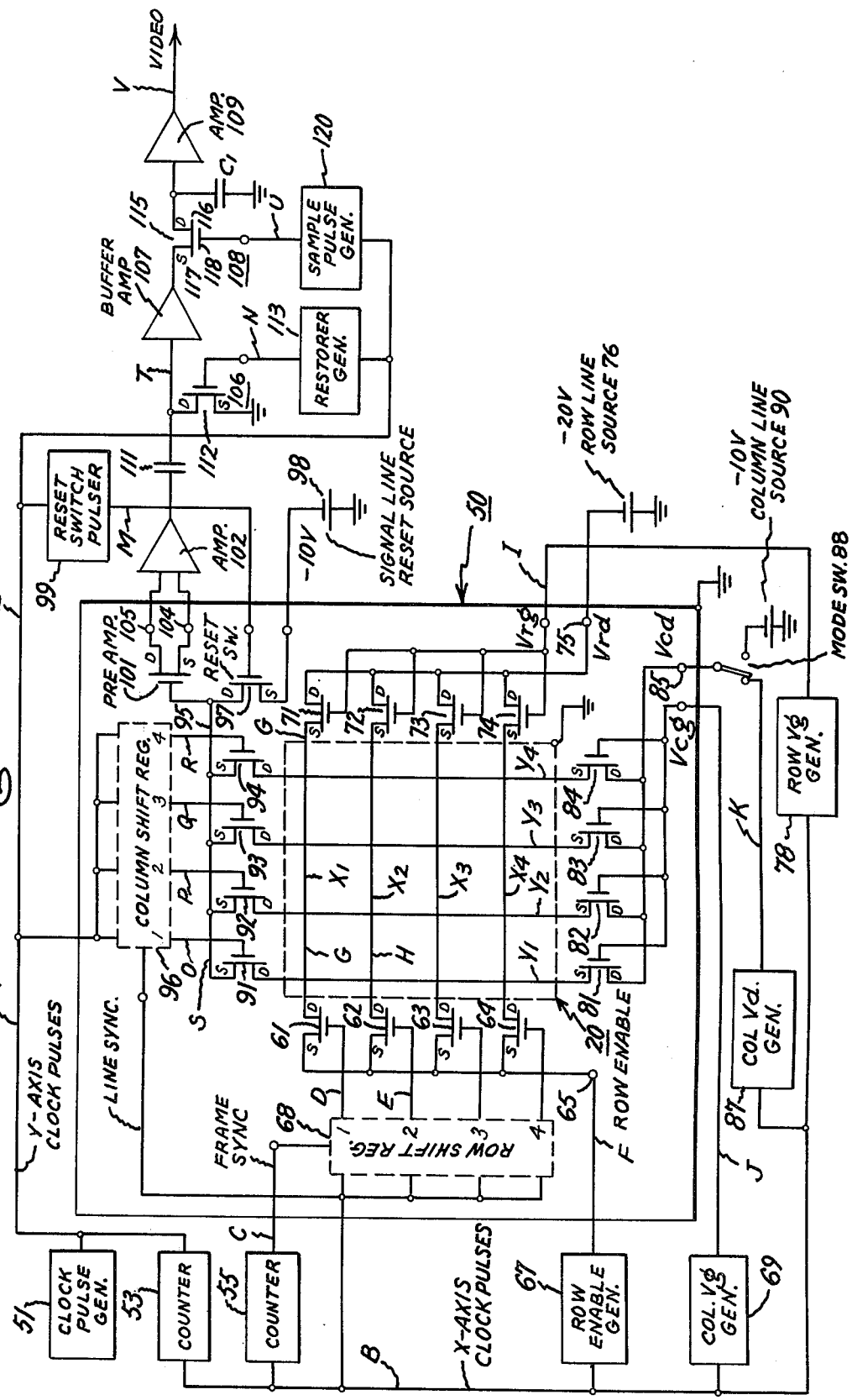
FIG. 5 is a block diagram of a system in accordance with the present invention including the image sensing array of FIGS. 1—4.

FIGS. 6A through 6V are diagrams of amplitude versus time of voltage signals occurring at various points in the system of FIG. 5. The diagrams of FIGS. 6A–6K are drawn to a common time scale and depict two lines of scan. The diagrams of FIGS. 6L–6V are drawn to another expanded common scale and depict a single line of scan. The point of occurrence of a signal of FIGS. 6A–6V in the block diagram of FIG. 5 is identified in FIG. 5 by a literal designation corresponding to the literal designation of the figure.

Before proceeding to describe the radiation sensing apparatus of FIG. 5 embodying the present invention the radiation sensing array used in the apparatus will be described. While a specific form of the array fabricated using a specific technology is shown and described, it will be understood that the array utilized in the apparatus may take on other forms and that any of the commonly used technologies for charge transfer devices may be used in the fabrication thereof. Reference is now made to FIGS. 1–4 which show an image sensing array 20 of radiation sensing devices 21, such as the device described in FIGS. 2A, 2B and 2C, of aforementioned U.S. Pat. No. 3,805,062 arranged in four rows and columns. The array includes four row conductor lines, each connecting the row-oriented plates of a respective row of devices, and are designated from top to bottom $X_1$, $X_2$, $X_3$ and $X_4$. The array also includes four column conductor lines, each connecting the column-oriented plates of a respective column of devices, and are designated from left to right $Y_1$, $Y_2$, $Y_3$ and $Y_4$. Conductive connections are made to lines through conductive landings or contact tabs 22 provided at each end of each of the lines. While in FIG. 1 the row conductor lines appear to cross the column conductor lines, the row conductor lines are insulated from the column lines by a layer 24 of transparent glass as is readily apparent in FIGS. 2, 3 and 4. In FIG. 1 the outline of the structure underlying the glass layer 24 is shown in solid outline for reasons of clarity.

The array includes a substrate or wafer 25 of semiconductor material of N-type conductivity over which is provided an insulating layer 26 contacting a major face of the substrate 25. A plurality of deep recesses 27 are provided in the insulating layer, each for a respective device 21. Accordingly, the insulating layer 26 is provided with thick or ridge portion 28 surrounding a plurality of thin portions 29 in the bottom of the recesses. In each of the recesses is situated a pair of substantially identical conductive plates or conductive members 31 and 32 of rectangular outline. Plate 31 is denoted a row-oriented plate and plate 32 is denoted a column oriented plate. The plates 31 and 32 of a device 21 are spaced close to one another along the direction of a row and with adjacent edges substantially parallel. In proceeding from the left hand portion of the array to the right hand portion, the row-oriented plates 31 alternate in lateral position with respect to the column oriented plates 32. Accordingly, the row-oriented plates 31 of pairs of adjacent devices of a row are adjacent and are connected together by a conductor 33 formed integral with the formation of the plates 31. With such an arrangement a single connection 34 from a row conductor line through a hole 39 in the aforementioned glass layer 24 is made to the conductor 33 connecting a pair of row-oriented plates. The column-oriented conductor lines are formed integrally with the formation of the column-oriented plates 32. The surface adjacent portion of the substrate 25 underlying the space between the plates 31 and 32 of each device 21 is provided with a P-type conductivity region 36. The glass layer 24 overlies the thick portion 28 and thin portion 29 of the insulating layer 26 and the plates 31 and 32, conductors 33 and column-oriented conductor lines $Y_1$—$Y_4$ thereof except for the contact tabs 22 thereof. The glass layer 24 may contain an acceptor activator and may be utilized in the formation of the P-type region 36. A ring shaped electrode 38 is provided on the major surface of the substrate opposite the major surface on which the devices 21 were formed. Such a connection to the substrate permits rear face as well as front face interception of radiation from an object to be sensed.

The image sensing array 20 and the devices 21 of which they are comprised may be fabricated using a variety of materials and in variety of sizes in accordance with established techniques for fabricating integrated circuits as described in the aforementioned U.S. Pat. No. 3,805,062.

Referring now to FIG. 5, there is shown a block diagram of radiation detection system including the image sensing array 20 of FIG. 1 which provides a video signal in response to radiation imaged on the array by a lens system (not shown), for example. The video signal may be applied to a suitable display device (not shown) such as a cathode ray tube as described in the above-referenced U.S. Pat. No. 3,805,062 along with sweep voltages synchronized with the scanning of the array to convert the video signal into a visual display of the image.

The system will be described in connection with FIGS. 6A–6V which show diagrams of amplitude versus time of signals occurring at various points in the system of FIG. 5. The point of occurrence of a signal of FIGS. 6A–6V is referenced in FIG. 5 by a literal designation corresponding to the literal designation of the figure reference.

The system includes a clock pulse generator 51 which develops a series of regularly occurring Y-axis pulses 52 of short duration shown in FIG. 6A, occurring in sequence at instants of time $t_1$–$t_8$ and representing a half scanning cycle of operation of the array. The output of the clock pulse generator 51 is applied to a first counter 53 which divides the count of the clock pulse generator by four to derive X-axis clock pulses 54, such as shown in FIG. 6B. The output of the first counter 53 is also applied to a second counter 55 which further divides the count applied to it by four to provide frame synchronizing pulses 56 to the array.

The sensing array 20, which is identical to the image sensing array of FIG. 1 and is identically designated, includes row conductor lines $X_1$ thru $X_4$ and column conductor lines $Y_1$ thru $Y_4$. The drive circuits for the row conductor lines $X_1$–$X_4$ and for the column conductor lines $Y_1$–$Y_4$ of array 20 are included on the same substrate 50 as the array to minimize the number of external connections which are required to be made for connection of the array 20 into the system.

To enable selective read out of a row of devices a plurality of row-enable switches 61–64 are provided. The row-enable switches 61–64 are in the form of MOSFET transistor devices formed integrally on the substrate, each having a source electrode, a drain electrode and a gate electrode. Each of the drains of devices 61–64 is connected to one end of a respective one of the row conductor lines $X_1$–$x_4$ and each of the sources of the devices 61–64 is connected to row enable terminal 65. The output 66 of the row enable generator 67, shown in FIG. 6F, is applied to terminal 65. The inputs to the row enable generator are the X-axis clock pulses of FIG. 6B. The gate electrodes of the transistors 61–64 are connected to successive output terminals of the row shift register 68, numbered respectively 1, 2, 3 and 4. The outputs 1 and 2 of the row shift register are shown, respectively, in FIGS. 6D and 6E. The outputs at terminals 3 and 4 are similar to output of terminal 1 except appropriately delayed in time to occur during the third and fourth line scan periods, respectively. The input to row shift register 68, referred to as frame sync is the pulse obtained at the output of the second counter 55. One frame sync pulse occurs for every sixteen Y-axis clock pulses. Oppositely phased clock drive pulses for the row shift register are derived from the X-axis clock pulses. The oppositely phased drive line pulses are applied to each of the stages of the row shift register to produce the indicated outputs at the terminals 1-4 thereof. The row shift register 68 may be any of a number of shift registers known to the art. The elements of the shift register 68 may be concurrently formed on the substrate at the same time that the devices of the image sensing array 20 are formed.

To reestablish storage voltage on all of the row lines and, in particular on the row just read out, row reset switches 71–74 are provided. The reset switches 71–74 are in the form of MOSFET transistors integrally formed on the substrate 50, each having a drain electrode connected to the other end of a respective one of the row conductor lines $X_1$–$X_4$ and each having a source electrode connected to a row line biasing terminal 75, which in the operation in the system is connected to the negative terminal of a —20 volt source 76, the positive terminal of which is connected to ground. Each of the gate electrodes of the transistors 71–74 is driven by a common drive signal 77 shown in FIG. 6I obtained from the output of the row Vg generator 78. The inputs to the row Vg generator 78 are the X-axis clock pulses.

To reestablish storage potential on all of the column lines after read out of a row of devices column reset switches 81-84 are provided. The reset switches are in the form of MOSFET transistors integrally formed on the substrate 50, each having a source electrode, a drain electrode and a gate electrode. Each of the sources of the devices 81-84 is connected to one end of a respective one column lines $Y_1$–$Y_4$ and each of the drains is connected to column drain terminal 85. The output 86 of the column Vd generator 87 shown in FIG. 6K is applied through a single pole double throw mode switch 88 to terminal 85. The inputs to the column Vd generator 87 are the X-axis clock pulses. With the arm of the switch 88 in the other position the terminal 85 is connected to the negative terminal of a —10 V column line source 90 the positive terminal of which is connected to ground.

Also integrally formed on the substrate 50 are a plurality of column line signal switches in the form of MOSFET transistors 91-94. Each of the transistors 91-94 has a drain electrode connected to the other end of a respective one of column conductor line $Y_1$–$Y_4$. The source electrodes of transistors 91-94 are connected to signal line 95. The gate electrodes of the transistors 91-94 are connected to successive output terminals of the column shift register 96, numbered respectively 1, 2, 3 and 4. The outputs 1, 2, 3 and 4 of the column shift register are shown, respectively, in FIGS. 6O–6R. The inputs to column shift register, referred to as line sync, are the X-axis clock pulses obtained from the output of the first counter 53. Oppositely phased clock drive pulses for the column shift register are derived from the Y-axis clock pulses. The oppositely phased drive pulses are applied to each of the stages of the column shift register to produce the indicated outputs at the terminals 1-4 thereof. Resetting of voltage on the signal line 95 before sensing the voltage on a column line is provided by signal line reset switch 97. The reset switch is in the form of a MOSFET transistor integrally formed on the substrate 50, and having a source electrode, a drain electrode and a gate electrode. The drain is connected to the signal line 95, the source is connected to the negative terminal of the signal line reset source 98 or reference, the positive terminal of which is connected to ground. The gate is connected to the output of reset switch pulse 99, the input of which is connected to the source of Y-axis clock pulses. The output of the reset switch pulser is shown in FIG. 6M. The pulse obtained from the reset switch pulser gates the transistor 97 to set the signal line 95 to the value of reset source 98 prior to actuation of each of the switches 91-94 thereby enabling the voltage on the column lines to be sensed in sequence as shown in FIG. 6S.

As the voltages sensed on the column lines are relatively small and as it is desirable to keep capacitance loading of the signal line small, amplification is provided on the substrate 50 in the form of a MOSFET transistor 101 integrally formed on the substrate and connected to circuit elements located off the substrate collectively designated as amplifier 102. The transistor 101 is shown having the gate electrode connected to the signal line 95 and sources and drain connected respectively to terminals 104 and 105 which in turn are connected to amplifier 102.

The video channel in addition to amplifier 102 includes a restorer circuit 106, a buffer amplifier 107, a sample and hold circuit 108 and a video output amplifier 109. The restorer circuit functions to eliminate offsets in the amplified signal line voltage and includes a capacitor 111 connected between the output of amplifier 102 and the input of buffer amplifier 107, and a transistor 112. The drain of the transistor is connected to the input of the amplifier 107 and the source is connected to ground. The gate is connected to the output of restorer generator 113 the input of which is driven by Y-axis clock pulses. The waveform and time of occurrence of the restorer generator output is shown in FIG. 6N. The restorer circuit functions to remove any offset voltage from the amplified signal line voltage including the uncertainty of the voltage on line 95 caused by operation of the reset switch 97, which is commonly called KTC noise. The sample and hold circuit 108 includes transistor 115 having a drain 116, a source 117 and a gate 118 and a capacitor $C_1$. The source to drain current flow path of the transistor 115 is connected between the output of the amplifier 107 and one terminal of capacitor $C_1$, the other terminal of which is connected to ground. The gate 118 is connected to sample pulse generator 120 which is driven by the Y-axis clock pulses and provides the train of sampling pulses 121 shown in FIG. 6U. Each of the pulses 121 are of short duration and are equally spaced along the time axis. One sampling pulse occurs for every Y-axis clock pulse. Each of the pulses 121 are phased to occur during the occurrence of a signal level at the output of amplifier 102 corresponding to a voltage level on a column line as sensed on the signal line.

In the operation of the system, the voltage of row line source 76, which is shown as −20 volts, establishes the charge storage capability of the row connected or oriented cells of each of the devices of the array and the voltage of the column line source 90, which is shown as −10 volts, (in the case of non-destructive read out) or the voltage derived at the output of the column Vd generator as shown in FIG. 6K establishes the charge storage capability of the column connected or oriented cells of each of the devices of the array. A requirement of the operation of the system of the present invention is that the storage capability of the row connected cell be greater than the column connected cell of each device. This is achieved by applying higher voltages to the row connected plates than to the column connected plates. Of course, the same result could be achieved by using a thicker layer of oxide under the column connected plate than the row connected plate and utilizing the same voltages on the column and row lines. Under the control of the clock pulse generator, frame synchronizing pulses, such as shown in FIG. 6C, are applied to the row shift register. Line interval gating pulses, two of which are shown for lines $X_1$ and $X_2$, in FIGS. 6D and 6E respectively are derived at the output points 1–4 in response to line rate clocking of the row shift register by the X-axis clock pulses. The line rate pulses are utilized to gate in sequence the row enable switches 61–64 to apply in sequence the row enable pulses of FIG. 6F to the row lines $X_1$–$X_4$.

With the row enable pulse applied to line $X_1$, the potential of line $X_1$ changes from −20 volts to zero and causes the charge stored in the row connected cells of the row to transfer to the column connected cells of the row.

Under the control of the clock pulse generator, line synchronizing pulses, shown in FIG. 6B, are applied to the column shift register 96. Device or element gating pulses such as shown in FIGS. 6O–6R are derived respectively at the output points 1–4 in response to the element rate clocking of the column shift register by the Y-axis clock pulses. The element rate pulses are utilized to gate in sequence the column line switches 91–94 connecting in sequence to the column lines $Y_1$–$Y_4$ to the signal line 95. Prior to such connection the signal line 95 is preset to the reference voltage of source 98 by the gating of reset switch 97 by the reset switch pulser 99. The pulser is synchronized with the Y-axis clock pulses and a pulse occurs prior to occurrence of each of the outputs of the column shift register. Upon the occurrence of an output at terminal no. 1 of the column shift register, for example, the voltage on the signal line 95 rises until equilibrium is established at level 131 and holds thereat, as illustrated in FIG. 6S, until a reset pulse occurs at which time the signal line 95 is dropped to −10 volts. The level 131 represents a measure of charge stored in the device in response to radiation received by the device located in the first row and in the first column of the array. Similarly, the levels 132–134 represent charge stored respectively in the second, third and fourth devices in the first row of the array. The voltage pulses on the signal line are amplified by amplifier 102, as shown in FIG. 6T, d-c restored by restorer circuit 106 and then sampled by sample and hold circuit 108.

Sampling pulses synchronized with the Y-axis clock pulses are timed to occur during the occurrence of the levels 131–134. During this interval the transistor 117 is turned on and permits the capacitor $C_1$ to charge to the voltages corresponding to these levels. Accordingly a video signal of the first row scan, such as shown in FIG. 6V, is obtained at the output of video amplifier 109 in which the signal shifts from one video level to another at the sampling interval in accordance with the voltage on the signal line 95 during the sampling interval.

After the devices on a row have been scanned and while the row line is at zero volts, the column gate pulse of FIG. 6J from column Vg gen 69 is applied to the gates of the column reset switches 81–84. With mode switch 88 in position to connect the output of column Vd generator 87 to terminal 85 the column lines are dropped to zero volts for a short interval of time as shown in FIG. 6K to cause charge stored in the column connected cells of row $X_1$ to be injected into the substrate (destructive read out) and the potential of the column lines to be reset at −10 volts. With the mode switch 88 in the other position connecting the drains of the reset switches 81–84 to the column line source 90, the column lines are reset at −10 volts and the charge stored in row $X_1$ is retained and may be reread, if desired, or charge could be allowed to accumulate and read on the next cycle of scan (non-destructive read out).

After the occurrence of the column gate pulse of FIG. 6J the row gate pulse of FIG. 6I occurs and acutates the gates of row reset switches 71–74 to reset the voltage level of the row lines $X_1$–$X_4$ to −20 volts. The other rows $X_2$–$X_4$, of the array are scanned and read out in sequence in exactly the same way and provides the video signal appearing at the output of the amplifier 109.

While in the exemplary embodiment of the invention the potentials applied to row lines is twice the potential applied to the column lines, other ratios of potentials may be utilized provided the potential utilized for the row lines is sufficiently greater than the potential utilized for the column lines so that charge stored in a device in response to received radiation may be stored entirely in the row connected cell of the device.

While in the exemplary embodiment read out of a row of devices is accomplished by collapsing the potential on the row lines to the potential of the substrate, such a requirement is not essential. A small bias may be maintained between the row line being addressed and the substrate to maintain a bias charge in the row connected cell to avoid the adverse effects of emptying and filling the surface states of semiconductor substrate. Of course, when the column lines are collapsed to inject charge into the substrate, the collapsing of the column lines could be to the same bias potential. In addition to avoiding adverse effects such as produced by the existence of surface states in the substrate, the bias charge in the cells of the device facilitates transfer of charge between the row connected and column connected cells of a device. This mode of operation is illustrated and explained in the aforementioned U.S. Pat. No. 3,805,062 in connection with FIGS. 9A–9E thereof.

While the invention has been described in connection with an array of sixteen devices, it is apparent that the invention is particularly applicable to arrays including devices many orders of magnitude greater in number than sixteen. Also, the devices may be organized in arrangements other than shown.

While the invention has been illustrated in a simple array, it is apparent that it is readily applicable to more complex array, wherein interlace scanning of rows or columns of devices is desired, such as described in U.S. patent application Ser. No. 441,054 filed Feb. 11, 1974 and assigned to the assignee of the present invention.

While the invention has been described in connection with an array constituted of an N-type conductivity substrate, a P-type conductivity substrate could as well be used. Of course, in such a case the applied potentials would be reversed in polarity.

While the invention has been described in specific embodiments, it will be appreciated that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. In combination,
   a substrate of semiconductor material having a major surface,
   a plurality of first conductive plates, each overlying and in insulated relationship to said major surface and forming a first conductor-insulator-semiconductor capacitor with said substrate,
   a plurality of second conductive plates, each adjacent a respective first conductive plate to form a plurality of pairs of plates, said pairs of plates being arranged in a matrix of rows and columns, each of said second conductive plates overlying and in insulated relationship to said major surface and forming a second conductor-insulator-semiconductor capacitor with said substrate, each coupled to a respective first conductor-insulator-semiconductor capacitor,
   a plurality of row conductor lines, the first conductive plates in each of said rows connected to a respective row conductor line,
   a plurality of column conductor lines, the second conductive plates in each of said columns connected to a respective column conductor line,
   a first voltage means for providing a first voltage between said row conductor lines and said substrate to deplete respective first portions of said substrate lying thereunder of majority charge carriers and provide a potential of a first value therein,
   a second voltage means for providing a second voltage between said column conductor lines and said substrate to deplete respective second portions of said substrate lying thereunder of majority charge carriers and providing a potential of a second value therein, said second value being less than said first value,
   means for exposing said substrate to radiation whereby charge is stored in said first portions of said substrate,
   first means for collapsing and reestablishing said first voltage on each of said row conductor lines in sequence during a respective first period of time, whereby charge stored in each of said first portions of said substrate moves to a respective second portion thereof,
   means for sensing in sequence the voltage on each of said column lines during said first period and deriving a video signal therefrom.

2. The combination of claim 1 including second means for collapsing and reestablishing said second voltage on said column rows after sensing the voltages thereon during said first period to cause charge stored in said second portions of the devices of said row to be injected into said substrate.

3. The combination of claim 2 including means for reestablishing said first voltage on said row lines after reestablishing said second voltage on said column lines.

4. The combination of claim 1 including means for floating said row lines after said first voltage is provided thereon and means for floating said column lines after said second voltage is provided thereon.

5. The combination of claim 1 in which said first voltage and said second voltage are approximately in the ratio of two to one.

6. The combination of claim 1 in which said sensing means includes means for connecting said column lines in sequence to a signal line on which is established a reference voltage prior to each connection and deriving signal level based on the difference of reference voltage on column line voltage.

7. The combination of claim 1 in which said sensing means includes means for establishing voltage levels in sequence on a capacitance in accordance with the voltage levels of said column lines.

8. The combination of claim 8 including means for periodically sampling the voltage on said capacitance to provide an electrical output varying in time in accordance with the variation in amplitude of the samples.

9. In combination,
   a substrate of semiconductor material having a major surface,
   a plurality of first conductive plates, each overlying and in insulated relationship to said major surface and forming a first conductor-insulator-semiconductor capacitor with said substrate,
   a plurality of second conductive plates, each adjacent a respective first conductive plate to form a plurality of pairs of plates, said pairs of plates being arranged in a row, each of said second conductive plates overlying and in insulated relationship to said major surface and forming a second conductor-insulator-semiconductor capacitor with said substrate, each coupled to a respective first conductor-insulator-semiconductor capacitor,
   a row conductor line, the first conductive plates in said row connected to said row conductor line,
   a plurality of column conductor lines, the second conductive plates in each of said columns connected to a respective column conductor line,
   a first voltage means for providing a first voltage between said row conductor line and said substrate to deplete respective first portions of said substrate lying thereunder of majority charge carriers and provide a potential of a first value therein, a second voltage means for providing a second voltage between said column conductor lines and said substrate to deplete respective second portions of said substrate lying thereunder of majority charge carriers and provide a potential of a second value therein, said second value being less than said first value, means for exposing said substrate to radiation whereby charge is stored in said first portions of said substrate, first means for collapsing and reestablishing said first voltage on said row conductor line during a first period of time, whereby charge stored in each of said first portions of said substrate moves to a respective second portion thereof, means for sensing in sequence the voltage on each of said column lines during said first period and deriving a video signal therefrom.

* * * * *